(12) United States Patent
Lindenstruth et al.

(10) Patent No.: US 10,653,041 B2
(45) Date of Patent: May 12, 2020

(54) FLUID-COOLED DATA CENTRES WITHOUT AIR CONDITIONING, AND METHODS FOR OPERATING SAME

(71) Applicant: ECUBE COMPUTING GmbH, Kriftel (DE)

(72) Inventors: Volker Lindenstruth, Mainz (DE); Horst Stöcker, Oberursel (DE); Alexander Hauser, Hanau (DE)

(73) Assignee: ECube Computing GmbH, Frankfurt (DE)

( * ) Notice: Subject to any disclaimer, the term of this patent is extended or adjusted under 35 U.S.C. 154(b) by 197 days.

(21) Appl. No.: 14/398,758

(22) PCT Filed: May 10, 2013

(86) PCT No.: PCT/EP2013/001391
§ 371 (c)(1),
(2) Date: Nov. 4, 2014

(87) PCT Pub. No.: WO2013/167280
PCT Pub. Date: Nov. 14, 2013

(65) Prior Publication Data
US 2015/0083363 A1 Mar. 26, 2015

(30) Foreign Application Priority Data

May 11, 2012 (EP) ..................................... 12003748
Nov. 23, 2012 (EP) ..................................... 12007913

(51) Int. Cl.
*H05K 7/20* (2006.01)
(52) U.S. Cl.
CPC ......... *H05K 7/208* (2013.01); *H05K 7/20718* (2013.01); *H05K 7/20745* (2013.01); *H05K 7/20781* (2013.01); *H05K 7/20836* (2013.01)

(58) Field of Classification Search
CPC .. H05K 7/208; H05K 7/2079; H05K 7/20763; H05K 7/2718; H05K 7/20745; H05K 7/20781; H05K 7/20836
See application file for complete search history.

(56) References Cited

U.S. PATENT DOCUMENTS 2,075,349 A 3/1937 Lawton
3,334,684 A * 8/1967 Mazorol, Jr. ...... H05K 7/20763
165/47

(Continued)

FOREIGN PATENT DOCUMENTS

CA        2 729 390      1/2010
DE   102005005588 A1     8/2006

(Continued)

OTHER PUBLICATIONS

Federal Energy Management Program; pp. 1-4; Geoffrey C. Bell, P.E. Jun. 2010 (This reference is being used for the 102(b) rejection stated in the Office Action).*

(Continued)

*Primary Examiner* — Nelson J Nieves

(57) ABSTRACT

Removal of heat generated by IT equipment in a data centre is facilitated by heat exchanging units mounted to back sides of open computer storage racks in which the IT equipment is mounted. One or more fans in the IT equipment generate an air flow across the IT equipment, and a heat exchanging unit mounted to the back side of the rack transfers heat in the air flow to a fluid coolant flowing through the heat exchanging unit. The heat exchanging unit has an air back pressure that does not significantly impede the air flow across the IT equipment, and a low fluid pressure drop for the fluid coolant, so that a cold air exhaust temperature of air exiting the heat exchanging unit is less than or equal to the room air temperature of input air entering the computer rack.

54 Claims, 2 Drawing Sheets

(56) References Cited

U.S. PATENT DOCUMENTS

Figure 1:
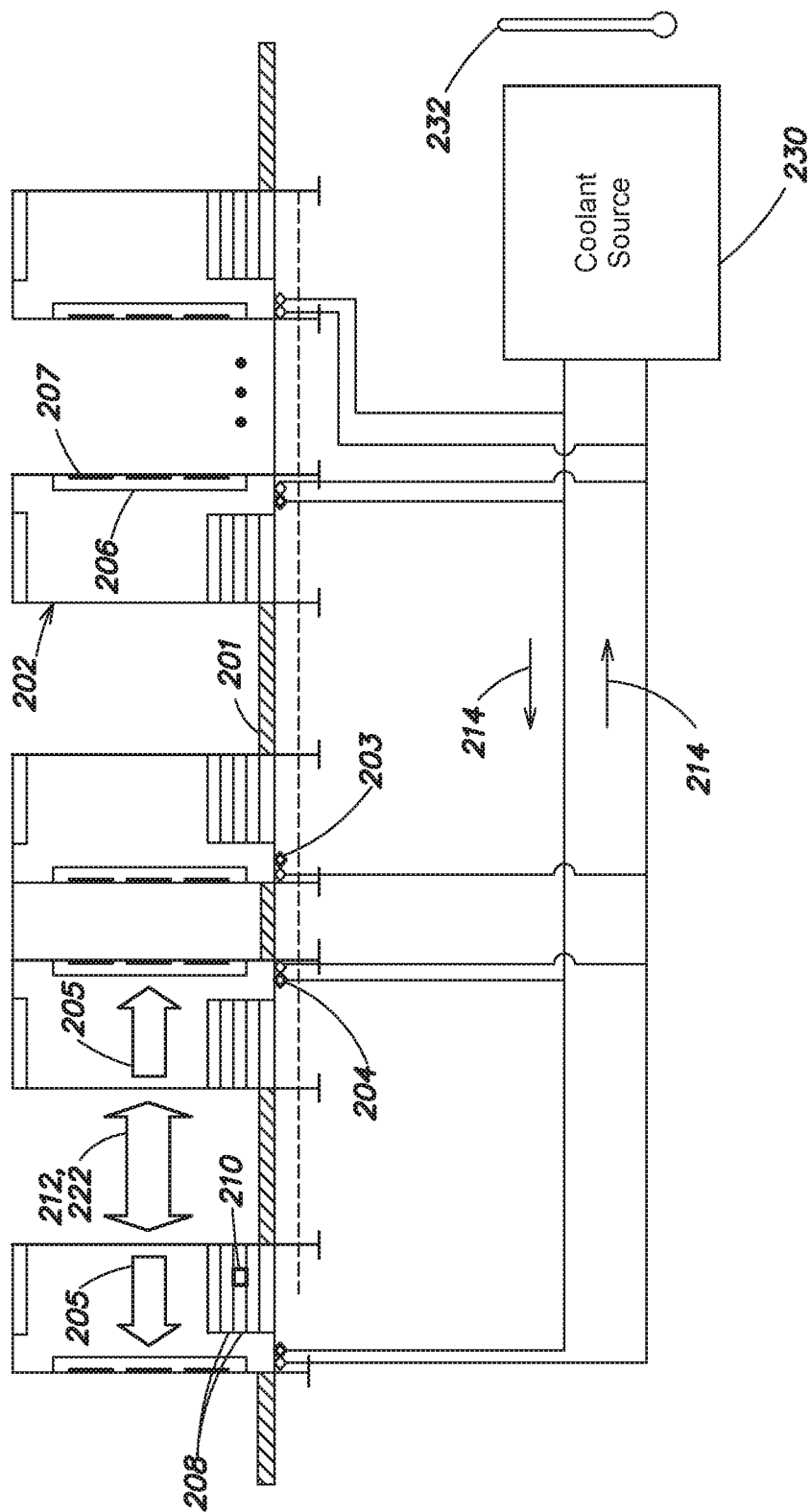

| | | | |
|---|---|---|---|
| 4,733,331 A | 3/1988 | Chauvet | |
| 5,323,847 A | 6/1994 | Koizumi et al. | |
| 5,509,468 A * | 4/1996 | Lopez | H05K 7/20763 165/144 |
| 6,301,837 B1 | 10/2001 | Ray | |
| 7,051,802 B2 | 5/2006 | Baer | |
| 7,278,273 B1 | 10/2007 | Whitted et al. | |
| 7,315,448 B1 | 1/2008 | Bash et al. | |
| 7,367,384 B2 | 6/2008 | Madara et al. | |
| 7,864,530 B1 * | 1/2011 | Hamburgen | H05K 7/2079 165/104.33 |
| 7,971,446 B2 | 7/2011 | Clidaras et al. | |
| 8,320,125 B1 * | 11/2012 | Hamburgen | H05K 7/2079 165/104.33 |
| 8,395,896 B2 | 3/2013 | Belady | |
| 9,476,605 B2 | 10/2016 | Lindenstruth et al. | |
| 2001/0042616 A1 | 11/2001 | Baer | |
| 2004/0050231 A1 * | 3/2004 | Chu | H05K 7/2079 83/574 |
| 2004/0190229 A1 | 9/2004 | Caci et al. | |
| 2006/0037331 A1 | 2/2006 | Nicolai et al. | |
| 2006/0077776 A1 | 4/2006 | Matsushima et al. | |
| 2006/0123288 A1 | 6/2006 | Luk | |
| 2006/0232945 A1 | 10/2006 | Chu et al. | |
| 2006/0289149 A1 | 12/2006 | He | |
| 2008/0029250 A1 | 2/2008 | Carlson et al. | |
| 2008/0093958 A1 | 4/2008 | Peterson | |
| 2008/0123288 A1 | 5/2008 | Hillis | |
| 2008/0236070 A1 | 10/2008 | Serinet | |
| 2008/0270572 A1 | 10/2008 | Belady et al. | |
| 2008/0273306 A1 | 11/2008 | Campbell et al. | |
| 2009/0126385 A1 | 5/2009 | Trepte | |
| 2009/0133866 A1 | 5/2009 | Campbell et al. | |
| 2009/0218078 A1 | 9/2009 | Brunschwiler et al. | |
| 2009/0229283 A1 | 9/2009 | Marsala | |
| 2011/0036107 A1 | 2/2011 | Muir | |
| 2011/0056675 A1 * | 3/2011 | Barringer | H05K 7/20736 165/299 |
| 2011/0100618 A1 * | 5/2011 | Carlson | H05K 7/2079 165/287 |
| 2011/0157829 A1 | 6/2011 | Wormsbecher et al. | |
| 2011/0175498 A1 | 7/2011 | Bash et al. | |
| 2011/0220324 A1 * | 9/2011 | Lindenstruth | H05K 7/2079 165/104.19 |
| 2011/0232889 A1 * | 9/2011 | Eckberg | H05K 7/2079 165/200 |
| 2012/0025679 A1 | 2/2012 | Roering | |
| 2012/0106073 A1 * | 5/2012 | Wu | H05K 7/208 361/679.52 |
| 2012/0175088 A1 * | 7/2012 | Su | H05K 7/2079 165/104.33 |
| 2012/0300398 A1 * | 11/2012 | Eckberg | H05K 7/2079 361/692 |
| 2014/0209272 A1 | 7/2014 | Stöcker et al. | |
| 2017/0078157 A1 | 3/2017 | Zhang | |

FOREIGN PATENT DOCUMENTS

| | | |
|---|---|---|
| DE | 102008030308 A1 | 12/2009 |
| EP | 2053911 A2 | 4/2009 |
| EP | 2 555 605 A1 | 2/2013 |
| WO | WO 02/052107 A2 | 7/2002 |
| WO | WO 03/083631 A1 | 10/2003 |
| WO | WO-2010000440 A1 | 1/2010 |
| WO | WO-2011141710 A1 | 11/2011 |

OTHER PUBLICATIONS

U.S. Appl. No. 15/291,421, filed Oct. 12, 2016, Lindenstruth.
International Search Report dated Dec. 9, 2012 from PCT Application No. PCT/EP2012/062924, 3 pages.
Notice of Allowance dated Aug. 24, 2016 from U.S. Appl. No. 13/001,947.
Office Action dated Sep. 6, 2013 from U.S. Appl. No. 13/001,947.
Office Action dated Mar. 11, 2014 from U.S. Appl. No. 13/001,947.
Office Action dated Aug. 13, 2014 from U.S. Appl. No. 13/001,947.
Office Action dated Apr. 24, 2015 from U.S. Appl. No. 13/001,947.
Office Action dated Nov. 3, 2015 from U.S. Appl. No. 13/001,947.
Office Action dated May 4, 2016 from U.S. Appl. No. 13/001,947.
Stöcker et al., co-pending U.S. Publication No. 2014-0209272, published Jul. 31, 2014.
Non-Final Office Action dated Nov. 19, 2015 from U.S. Appl. No. 14/236,417, 22 pages.
Non-Final Office Action dated Aug. 11, 2016 from U.S. Appl. No. 14/236,417, 21 pages.
Final Office Action dated Apr. 19, 2016 from U.S. Appl. No. 14/398,758, 23 pages.
Notice of Allowance dated May 4, 2017 from U.S. Appl. No. 14/236,417, 17 pages.
"CyberChill water-cooled server racks", Stulz Air Technology Systems, Oct. 1, 2006.
"Data Center Rack Cooling with Rear-door Heat Exchanger", Technology Case-Study Bulletin, United States Department of Energy, Energy Efficiency & Renewable Energy Federal Energy Management Program, Jun. 1, 2010.
International Search Report for PCT/EP2013/001391 dated Jul. 24, 2013.
U.S. Pat. No. 9,476,605, Oct. 25, 2016, Lindenstruth et al.
U.S. Appl. No. 14/236,417, filed Apr. 10, 2014, Stöcker et al.
U.S. Appl. No. 15/291,421, filed May 10, 2013, Lindenstruth et al.

* cited by examiner

FLUID-COOLED DATA CENTRES WITHOUT AIR CONDITIONING, AND METHODS FOR OPERATING SAME

CROSS-REFERENCE TO RELATED APPLICATIONS

This application is a national stage application (under 35 U.S.C. § 371) of PCT/EP2013/001391, filed May 10, 2013, which claims benefit of European Application No. 12003748.6, filed May 11, 2012, and European Application No. 12007913.2, filed Nov. 23, 2012, all of which are incorporated herein by reference in their entirety.

The present invention relates to a method for operating a data centre, which is adapted to house a multiplicity/plurality of racks being designed to provide storage space for IT equipment. The data centre is equipped with cooling means in order to provide dissipation of heat being generated by the IT equipment.

In the prior art, there exist various data building structures for housing a multiplicity of racks, each of which comprising storage space for IT equipment.

Conventional data centres most typically are buildings, which comprise a false floor for a computer infrastructure, which is typically housed in 19" rack enclosures. In conventional data centres, the cooling is still accomplished by cold air, which is pumped into the false floors having holes at the appropriate locations in front of the racks. In this way cold air is supplied at the air intakes of the computer racks. This design typically requires the concept of guided airflows, feeding cold air into the racks and removing the heat from the IT equipment.

WO 2010/000440 discloses a typical state of the art conventional data centre building in FIG. 1. This conventional design is somehow disadvantageous, because the single racks have to be designed as closed racks and the air flow through respective racks has to be surveyed and controlled in order to avoid pumping unnecessary amounts of cold air from the cold aisle. There exist various concepts, providing a regulation of the air flow into the cold aisle, such that the fans providing the air flow operate at the lowest possible power. The hot air generated by equipment inside the rack is fed back to heat exchangers being located somewhere else in the data centre building. The heated air is either cooled down again or fresh air is used in order to provide a stream of cold air.

The prior art, such as WO 2010/000440, outlines the use of water cooled racks for high density data centres. In the prior art the heat of the electronic equipment is transferred to cooling water by way of heat exchangers, as disclosed in WO 2010/000440, or either mounted in the racks or in the aisles. Other prior art uses direct cooling of the electronic equipment installed in the racks with water.

Besides the typical state of the art conventional data centre building, WO 2010/000440 discloses a new energy efficient architecture for multi-storey computer data centre using liquid cooling media for dissipation of heat being generated by the IT equipment. The so called Green-IT concept realised by WO 2010/000440 allows the reduction of energy consumption for cooling. Conventional data centres often require up to 50%, and even more, of their energy consumption for cooling. The novel cooling concept of WO 2010/000440 enables data centres which require less than 10% (partial PUE <1.1) of their energy for cooling.

The stationary multi-storey computer data centre of WO 2010/000440 becomes a kind of benchmark for later Green-IT concepts to follow as a constant development towards energy efficient data centre.

However, stationary computer data centers as disclosed in WO 2010/000440 require a constant demand for such centres and therefore are considered as long-time investments. In addition, mobile data centres become more and more attractive, because such mobile data centre container can easily be installed in the near neighbourhood and contain their own infrastructure so that they can be "plugged-in" where stationary computer data centre are undersized and/or only temporary needs exist.

The design of the data centres, whether they are mobile or stationary is subject to constant improvement to optimise the costs for cooling the IT equipment. Beside the design, the methods for operating such data centre allow for further improvement to achieve optimised energy consumption for cooling.

This invention is to provide such a method for operating a stationary or mobile data centre unit.

Therefore, the instant invention relates to a method for operating a data centre comprising:
(i) a building for housing a multiplicity of racks (202), each rack being an open rack housing IT equipment,
(ii) the racks (202) being an open rack housing IT equipment (200)
(iii) the racks (202) comprise heat exchanging means (206, 207) being adapted to transfer the heat generated by the IT equipment to a fluid coolant, said heat exchanging means being an element of the racks or an element attached to the racks,
(iv) at least one first cooling circuit (203, 204), said cooling circuit being a closed cooling circuit, which is adapted to supply the heat exchanging means (206, 207) of the racks (202) with a fluid coolant and is further adapted to convey the heated coolant away from the heat exchanging means (206, 207) of the racks (202) through the reflux of the cooling circuit,
(v) said first cooling circuit (203, 204) being connected to a source providing coldness, said source being located outside the space housing the multiplicity of racks,
(vi) the IT equipment (200) located in the respective racks having active means, preferably fans, for cooling parts of the IT equipment, preferably the CPU and/or GPU and/or a storage hardware, said active means creating an air flow (205) in the rack towards the heat exchanging means (206, 207) being an element of the racks or an element attached to the racks,
(vii) said racks (202) having no other active means, in particular fans, except for those contained within the aforementioned IT equipment, for creating an air flow in the rack towards the heat exchanging means being an element of the racks or an element attached to the racks,
(viii) said building for housing the multiplicity of racks (202) comprising no other active means, except for those contained within the aforementioned IT equipment (200), for creating an guided air flow,
(ix) at least one electrical power input,
(x) at least one mean for distributing the electrical power from the power input to the individual racks, allowing redundant power supplies in every rack, comprising the measures
(a) providing a fluid coolant from the source providing coldness to the heat exchanging means (206, 207) of the racks (202) within the first cooling circuit, said fluid coolant input flow entering the heat exchanging means (206, 207) having a temperature of 1K to 5K, preferably 1K to 3K, more preferred 1K to 2K, below the temperature of the fluid coolant return flow exiting the heat exchanging means (206, 207) of the racks (202), (b) controlling the fluid coolant flow within the first cooling circuit (205) which is adapted to supply the heat exchanging means (206, 207) of the racks (202) to maintain the temperature of fluid coolant entering the heat exchanging means (206, 207) of the racks (202) (input flow) having a temperature of 1K to 5K, preferably 1K to 3K, more preferred 1K to 2K, below the temperature of the fluid coolant return flow exiting the heat exchanging means (206, 207) of the racks (202), (c) conveying the heated fluid coolant leaving the heat exchanging means (206, 207) of the racks (202) (return flow) to the source providing coldness, said source being located outside the space housing the multiplicity of racks, to remove the heat from the heated fluid coolant to a temperature of 1K to 5K, preferably 1K to 3K, more preferred 1K to 2K, below the temperature of the fluid coolant return flow and returning the fluid coolant to the at least one first cooling circuit.

The present invention provides for a method for operating a data centre, avoiding the necessity of guiding the cooling air across all racks to create cold aisle within the data centre. The only active means are typically fans contained within the aforementioned IT equipment, which create an air flow (205) in the individual rack towards the heat exchanging means of the respective rack. These active means, such as built-in fans in the IT equipment, typically do not exceed 10% of the electrical power of the IT equipment installed and operating.

While still using the present invention one may use non-substantive active means which do not contribute to the air flow (205) in the rack, e.g. by installing fans other than those contained within the aforementioned IT equipment. Such non-substantive contribution of such additional non-substantive active means provide at most 10% of the air flow (205) generated by the active means contained within the aforementioned IT equipment.

The present invention provides for a method for operating a data centre containing racks housing IT equipment. Such IT equipment includes all electronic equipment used in connection with IT equipment, which generates heat during operation.

The present invention provides for a method in which at least one cooling circuit is operated supplying a fluid coolant into the data centre for cooling. In the present invention, the temperature of the fluid coolant entering the data centre and the temperature of the fluid coolant entering the heat exchanging means (206, 207) is almost equal, which means that the temperature of the fluid coolant entering the data centre is at most 0.2K below the temperature of the fluid coolant entering the heat exchanging means (206, 207).

In a preferred embodiment the present invention provides for a method for operating a data centre in which the power density of the IT equipment in the racks being at least 5 kW (electrical) per rack, more preferred at least 8 kW (electrical) per rack, most preferred at least 10 kW (electrical) per rack. The upper limit for the power density per rack is mostly limited on the space available inside the rack. Thus the upper limit is not limited per se and typically can reach up to 1 kW or 1.5 kW per height unit in the rack. For a typical rack the power density per rack amounts up to 42 kW (electrical) per 42 height unit rack.

The present method avoids the necessity of false floors used in that context, too. In addition, the invention aims at optimizing energy requirements and costs plus at arranging the computer racks more densely in order to minimize the required length of the network cables and to improve the system's communication capabilities.

The present method for operating a data centre allows the data centre to have a compact structure comprising larger, scalable capacities and an increased volume density. The present method for operating a data centre can be used for two dimensional arranged data centres, where the racks are located on one level, or for three dimensional arranged data centres, where the racks are located on more than one level within the data centre.

The benefit of the present method for operating a data centre increases with the power density of the IT equipment installed within the racks. Such increased packing or storage density for IT equipment, such as computer hardware, which provides a heat dissipation, which can even exceed a volumetric heat dissipation rate of 1 kW per m3 and more, preferably 1.5 kW per m3 and more, more preferably 2 kW per m3 and more, more preferably 3 kW per m3 and more, which cannot be achieved using the conventional air cooling systems which are the state of the art system nowadays. The aforementioned volumetric heat dissipation rate is based on a data centre having 2.5 m ceiling height and the net area used in the data centre. The net are area of the data centre is the area, which is occupied by the racks housing the IT equipment, excluding any additional space for technical building infrastructure, such as transformers, power generators, battery rooms, fire extinguishing systems, storage area and the like. In the preferred embodiment of the invention a rack is 120 cm deep and 70 cm wide. The racks are mounted with a distance of 120 cm between rack rows. Therefore in the preferred embodiment of the invention a rack consumes 1.7 m2 of floor space and 4.2 m3 of the net data centre area. Closer configurations, for instance with 60 cm wide racks and smaller distances are conceivable.

Thus the net area of the data centre used in connection with the instant invention is the surface used to house the IT-equipment racks. It is total surface of the data center minus the surface used for technical infrastructure (power supply, cooling, UPS, batteries, generators, fire management and other), for the access infrastructure (non-secured and secured zones), preparation and storage surface for IT-equipment as well as the IT-control rooms and other surface needed for the management of the data center.

For practical reasons the volumetric heat dissipation rate in conventional air cooling system, typically, does not exceed 6 kW per Rack, which corresponds to about 2.5 to 3 kW/m$^2$ and about 0.7 to 0.9 kW/m' using the aforementioned assumptions.

All power densities per rack and other units derived therefrom refer to the electrical power of the IT equipment installed and operating in the respective rack.

As explained above, the benefit of the present method for operating a data centre increases with the power density of the IT equipment installed and operating within the racks. In particular, for data centre having racks with installed and operating IT equipment creating a volumetric heat dissipation rate which corresponds to least about 5 kW/m$^2$, preferably to least about 10 kW/m$^2$, most preferred to least about 20 kW/m$^2$, using the aforementioned net area of the data centres/data centres room housing the racks, an extremely efficient cooling is provided.

The present method for operating a data centre implements open racks with passive heat exchangers, said heat exchanging means being an element of the racks or an element attached to the racks, which are built such, that most of the heated air, in the best mode the entire heated air of the IT equipment installed inside the rack is cooled back to the set room temperature. Preferably the heat exchangers are located on the back side of the rack. The actual position of the heat exchangers is determined by the direction of the air flow (205) generated by the active means of the IT equipment. In a preferred embodiment of the invention, the angle of incidence of the air flow generated towards the surface of the heat exchanger is at most 75°, more preferred at most 60°, more preferred at most 45°, more preferred at most 20°, most preferred between 0° and 20°.

The design of the passive heat exchanger being an element of the racks or an element attached to the racks, preferably being located at the back side, of the racks is also important because if they produce a very high back pressure towards the natural airflow the overall cooling efficiency is reduced. Avoiding such back pressure inside the rack has manifold advantages. First heterogeneous equipment can be mounted inside the rack because the low back pressure cannot have a negative effect on the airflow of other IT equipment. For instance a high power server, mounted below a low power server will not push it's hot exhaust air back into the low power server, provided there is little back pressure inside the rack. A second advantage is that there are little requirements towards the sealing of the cable feeds through the rack. Normal cut-outs or cable openings require self-sealing inserts, such as e.g. KoldLok® sealings.

The use of such self-sealing inserts in the instant invention is possible but not mandatory. Due to the avoidance of state of the art air-cooling and that guided air flows in the data centre are not required; the potential leakage rate of hot air is very limited in the instant invention.

The room temperature of the space housing the multiplicity of racks corresponds to the cold air exhaust of the passive heat exchangers being an element of the racks or an element attached to the racks and is therefore connected to the fluid coolant temperature. Preferably, the room temperature of the space housing the multiplicity of racks is about +2K, more preferably +1K, more preferably +0.5K, most preferred about the same, of the temperature of the return flow of the fluid coolant of the first cooling circuit. The instant method providing highly efficient cooling of the racks allows for higher room temperatures as there are no risks of heat loops anywhere in the data centre. The only area of hot air is inside the racks.

The back cooling can be realised via the aforementioned source of coldness, including but not limited to, external cold water sources, such as ground or surface water, evaporation cooling which operates based on the evaporation principle, including evaporation cooling towers with or without open cooling towers, hybrid coolers, dry coolers and the like, and any other state of the art cooling techniques, including compression chillers.

The highest cooling and cost efficiency is achieved by usage of counter flow, indirect draft, wet cooling towers. The cooling principle of such cooling towers uses the evaporation heat of water by evaporating water. For instance to cool a 1 MW data centre about up to 1.7 m$^3$ of fluid coolant, such as water, are required for evaporation per hour. The cooling tower is entirely passive except a fan, which is typically operated only if the outside air temperature exceeds 15° C. The lowest temperature achievable, using open wet coolers corresponds to the wet bulb temperature. It is measured psychometrically by covering a thermometer with wet cloth. The usage of evaporation coolers ensures that the coldest water supply temperature is above the dew point. Therefore there is no risk of condensation anywhere inside the data centre. The water supplies do not have to be insulated.

The operating method of the preferred embodiment of this invention uses water as cold fluid coolant, in which the fluid coolant entering the data centre for cooling via the at least one cooling circuit has temperature almost equal to the temperature entering the heat exchanging means (206, 207). In this context, almost equal means that the temperature of the fluid coolant entering the data centre is at most 0.2K below the temperature of the fluid coolant entering the heat exchanging means (206, 207).

In a preferred embodiment, the instant method operates with a temperature of the return flow of the fluid coolant of the first cooling circuit being dependent on the particular power density installed and operating in the racks. For power densities of up to 10 kW (electrical) per rack, the temperature of the return flow of the fluid coolant of the first cooling circuit being at most 3K, preferably at most 2K, most preferred at most 1K, above the temperature supplied by the source of coldness entering the data centre and for power densities of at least 10 kW (electrical) per rack, the return flow of the fluid coolant of the first cooling circuit being at most 4K, preferably at most 3K, above the temperature supplied by the source of coldness.

The aforementioned temperature difference between the return flow of the fluid coolant of the first cooling circuit and the fluid coolant input flow can also be higher for reduced fluid coolant flow rates. Thereby the power demand by the required pumps operating the cooling circuit is reduced during colder seasons or periods of colder outside temperatures, typically at outside temperatures below 17° C., when the back cooling system/source of coldness produces/provides sufficient low temperature/cold fluid coolant at no extra costs.

Typically the racks used in the instant method are common 19" rack enclosures. In a preferred embodiment, the racks are tall racks which are particularly space-saving. The racks are placed on the floor of the building and not necessarily on false floor systems. Pipes and/or cable trays are mounted above the racks. In case of an existing false floor for the retrofit of an existing data centre such false floor can be equally used to conduct the pipes. The heat exchanger doors can be connected to the cooling circuit from below and above. In a further preferred embodiment such as the data centre being a mobile data centre, the racks are connected to the surrounding enclosure via shock-absorbing means, thus protecting the racks and any associated/connected means, like heat exchanging means and cooling pipes, against vibration and shocks during transportation and assembly.

The term "open" in connection with the present racks means that the front of the racks is open and allows the IT equipment inside the rack to intake room air without flow resistance. It is also possible to have an open front door, e.g. a lattice door, which allows air to flow through without substantial flow resistance. Such lattice door is the preferred embodiment as it allows the measurement of the temperature of the air-intake. In this preferred embodiment, two measurements are carried out, typically one at one third height of the lattice door, and the second at about two thirds height of the lattice door. The open rack concept operated in the instant method allows intake of room air and exhausting of such air taking up the heat generated by the IT equipment. In a preferred embodiment, the air entering the open rack and the air exiting the IT equipment towards the heat exchanging means (206, 207) are separated by decoupling means inside the rack, separating the air exiting the IT equipment towards the heat exchanging means (206, 207)

from the air entering the open rack to ensure that no heated air is soaked into the IT equipment.

Another advantage of the rack-based heat exchanging means is that the racks themselves do not have to be kept closed and that the air flow into and out of the racks does no longer have to be controlled. As a further benefit, inside the data centre, there are no additional air conditioners required, as the cooling function may be completely taken over by the heat exchanging units of the racks.

The racks used in the present invention do not have any other active means, in particular fans, for creating an air flow in the rack towards the heat exchanging means being an element of the racks or an element attached to the racks. Only the IT equipment located in the respective racks having active means, preferably fans, for cooling parts of the IT equipment, preferably the CPU and/or GPU and/or a storage hardware, and only said active means cooling parts of the IT equipment creating an air flow in the rack towards the heat exchanging means being an element of the racks or an element attached to the racks.

The instant method for operating a data centre does not require data centre having false floor and cold aisles arrangements or design.

Most preferred are passive heat exchangers having a depth of about 50 to 120 mm which can cause only a very low air back pressure. Therefore hot air leaving the IT equipment in the racks can pass the heat exchanger all by itself.

As already mentioned, the power density in modern computers has reached 1 kW and even more per height unit installed in a rack. The active cooling means of the IT equipment installed in a rack, such as the fans for cooling parts of the IT equipment, preferably the CPU and/or GPU and/or a storage hardware, create appropriate air flow rates to remove the entire heat from the IT equipment. The air flow rate depends on the temperature difference $\Delta T$ between the air entering the rack and the air leaving the IT equipment. Typical temperature differences are $\Delta T=5$ to 30 K. This temperature difference requires an air volume current of 100 to 600 $m^3/(h*kW)$, which corresponds to at least 0.5 m/s, preferably of at least 0.8 m/s, in particular of at least 1.1 m/s.

State of the art IT equipment is designed to operate at a temperature difference between cold and hot air around 10 K. Therefore, the air flow rate inside a 42 height unit 19-inch rack is a linear function of the power generated by the electronic equipment and the average air temperature difference generated by the equipment. Hence, operating with the 10 K difference and having IT equipment installed corresponding to 20 kW electrical power, an air volumetric current of 6000 $m^3/h$ which corresponds to an air flow rate of 2.1 m/s for such 42 height unit 19-inch rack is suitable. Such air flow rate in the instant method is solely created by the active cooling means of the IT equipment per height unit installed in a rack, such as the fans for cooling parts of the IT equipment, preferably the CPU and/or GPU and/or a storage hardware.

The instant method for operating a data centre allows the transfer of the heat generated by the IT equipment installed inside the rack to the fluid coolant without any additional active elements.

In case the racks are not fully equipped with IT equipment, it is beneficial to close large open slots, e.g. being greater than 3 height units, inside the rack in order to avoid hot air leaving the rack towards its front side. Small openings for cabling do not present a problem due to the low pressure inside the rack.

The instant method for operating a data centre preferably allows efficient cooling of a data centre in which the power density of the IT equipment in the racks being at least 5 kW (electrical) per rack, more preferred at least 8 kW (electrical) per rack, most preferred at least 10 kW (electrical) per rack. The upper limit for the power density per rack is mostly limited on the storage space available. Thus the upper limit reaches typically 1 kW per height unit in the rack, thus typically amounting up to 42 kW (electrical) per rack.

The racks used in the instant invention typically have dimensions of 1.2 m×0.7 m×2 m and are preferably arranged front to back for highest efficiency and back to back for highest redundancy.

While most IT equipment, such as servers, implement a front-to-back airflow there are exceptions to this rule. For instance Cisco Nexus switch series receive cold air at the front and the right side of the chassis while hot air is exhausted at the left and the back side of the system. These switches do require 1 m wide racks also. In the preferred embodiment of this invention such airflow requirements are accommodated by use of 1 m wide racks, which seal the left front and right back of the rack. Similar configurations are conceivable for IT equipment using their chassis sides for air intake. The side openings of the racks do not have to cover the full height of the rack. Special switch compartments are conceivable.

Also horizontal airflow separations at the back of the rack are conceivable, for instance in order to allow very specific determination of sources of potential smoke and for selectively switching off the appropriate servers.

Many passive sheet metal air guides are conceivable in the preferred embodiment of the invention in order to guide cold or hot air and to potentially separate regions inside the rack. Such air guides are entirely passive and do not adversely affect the cooling efficiency of the system. It should be noted that such air guides are generally not required in the preferred embodiment of the invention and are merely used to fit existing devices into the racks.

The present method for operating a data centre implements open racks with passive heat exchangers being an element of the racks or an element attached to the racks, preferably as back doors, which are built such, that most of the heated air, in the best mode the entire heated air of the IT equipment installed inside the rack is cooled back to the set room temperature.

The individual passive heat exchanger being an element of the racks or an element attached to the racks, and preferably is located at the back of the individual rack and capable of transferring the entire heat generated by the IT equipment installed and operating within the rack to the fluid coolant.

According to a preferred embodiment of the invention, the capacity of the heat exchangers is given by the nature of the fluid coolant, the coolant input flow and the temperature difference of the coolant input flow and coolant output flow. In the instant method, the cooling capacity of the sum of all heat exchanging means installed corresponds to the heat generated by the IT equipment installed and operating in the data centre. Thus, the instant invention ensures that no or no substantial amount of heat generated by the IT equipment is released to the space housing the multiplicity of racks, typically referred to as the data centre.

The instant invention allows for operating a data centre in which the air entering the racks, typically from the front side, and the air leaving the racks, typically at the back side through the heat exchanging means, have the same or essentially the same temperature and substantially all the heat generated is removed by the heat exchanger and the fluid coolant. Preferably, the temperature of the air entering the racks and the temperature of the air leaving the racks, typically at the back side through the heat exchanging means, differ by less than +2K, more preferably +1K, more preferably +0.5K, most preferred is about the same. Thus no heat or no substantive heat is released to the space/building housing the racks of the data centre.

As a result, the instant method providing highly efficient cooling of the racks allows for higher room temperatures as there are no risks of heat loops anywhere in the data centre. The only area of hot air is inside the racks.

The instant invention allows that the heat exchanging means directly receive the hot air generated by the IT equipment inside the rack and transform this hot air back down to a desired room temperature by simply conveying the heat to the fluid coolant conveying piping. In this way, any routing of hot air or creating any air flows inside the data centre can be avoided. By allowing this, the distance over which hot or heated air travels can be reduced to a minimum. It is only required to transport the heated air inside the rack, in particular from the IT equipment to the heat exchanging means. In this way, any difficult-to-control turbulent air flow can be prevented. In addition, the instant invention does not require the high throughput flow of cold air and the problems relates with any condensation of moisture being present in such air. Hence, the use of any air dehumidifiers becomes superfluous.

According to another preferred embodiment of the invention, the heat exchanging means do not comprise any active means, such as fans, for guiding the heat/hot air from the IT equipment to the surface of the heat exchanging means or through the heat exchanging means. The relatively low and laminar stream of air obtained from the CPU and/or GPU cooling fans inside the particular rack allow to avoid additional fans and to avoid any additional fan power consumption.

The present method for operating a data centre uses passive heat exchangers having a low air backpressure. The air backpressure generated by the heat exchanger depends on the air flow rate. The heat exchangers used in connection with the instant method preferably have an air backpressure of maximum 10 Pa for air flow rate corresponding of up to 0.5 m/s, more preferred of maximum 16 Pa for air flow rate corresponding of up to 0.8 m/s, most preferred of maximum 20 Pa for air flow rate corresponding of up to 1.1 m/s.

The aforementioned air flows and air back pressure work well with the IT equipment installed in the racks, which typically operate within the temperature difference between cold and hot air being around 10K.

The instant method uses fluid coolant system. One major concern in data centres it the potential of leaks, in particular for water being used as fluid coolant.

The risk of water spills and the amount of damage caused by spills corresponds to the pressure of the water system. Therefore, a further aspect of the instant method is to use heat exchangers having a low pressure drop across the heat exchanger.

The present method for operating a data centre uses passive heat exchangers having a low pressure drop across the heat exchanger.

The pressure drop across the heat exchanger depends on the volumetric fluid flow of the fluid coolant. Therefore, in the instant invention, the passive heat exchangers situated at the backside of the racks provide preferably a pressure drop below 22 kPa for a volume current of 3 $m^3$/h for water, preferably below 54 kPa for 5 $m^3$/h for water, most preferred below 200 kPa for 10 $m^3$/h for water.

Operating at a pumping rate below 5 $m^3$/h for water, the instant method can be accomplished below atmospheric pressure of the fluid coolant being water.

The present method for operating a data centre requires controlling the fluid coolant flow within the first cooling circuit (205) which is adapted to supply the heat exchanging means (206, 207) of the racks (202) to maintain the temperature of fluid coolant entering the heat exchanging means (206, 207) of the racks (202) (input flow) having a temperature of 1K to 5K, preferably 1K to 3K, most preferred 1K to 2K, below the temperature of the fluid coolant return flow exiting the heat exchanging means (206, 207) of the racks (202). Thus, the flow rate for the fluid coolant, such as water, is preferably from 0.9 $m^3$ per hour and per kW installed and operating for a difference of 1K and to 0.17 $m^3$ per hour and per kW installed and operating for a difference of 5K.

One remaining concern was the potential power increase caused by the servers' cooling fans due to the back pressure of the heat exchanger. This was tested by opening and closing the back door of the rack and determining the total power consumption of the computers inside the rack. Both the total power consumption of all servers in a rack and the supply current to one sample fan were measured. There was no significant difference in power consumption measured when opening the back door, primarily due to the low back pressure.

Preferably, each rack implements autonomous power distribution units, supplying power to all electric components inside the rack and monitoring the power consumption and electric properties, in particular for high power densities, e.g. used in scientific applications. This functionality is provided by an embedded micro controller. It measures in addition air input and output and cooling water temperatures. Further each rack implements an independent smoke detector. In case of a smoke alarm or overheating the servers are configured to automatically shut down. After exceeding configured thresholds, the PDU will ultimately cut the power. Such safety measures are important per rack because of the high power density and corresponding fast temperature rise in case of a cooling failure.

The heat exchanging means of the racks are connected to a cooling circuit which supplies fluid coolant, preferably liquid coolant, to each of the heat exchanging means through a piping system.

In a preferred embodiment of the invention, the cooling circuit comprises a piping system to remove the coolant. Usage of a liquid coolant such as water and other suitable cooling fluids, particularly with larger thermal capacities than air, is advantageous due to numerous reasons. At first, the total heat quantity that may be transferred and transported is, compared to gaseous coolants, much larger. Secondly, it is possible to control and monitor the flow and the transmission of the coolant more easily, compared to a turbulent and laminar flow of a gaseous coolant.

In another embodiment of the invention, the pressure of the liquid coolant can be set up to below 2 bar, so that in case of a leakage minimal fluid ejection of the liquid occurs and the leakage liquid flows along the cooling circuit. In such embodiment the cooling circuit may have a hollow/sink to collect any such leakage liquid preventing that any such leakage liquid comes into contact with the computer hardware. The piping is arranged behind the rack's back door, which presents a protection of the IT equipment against water spills due to the fine granular heat exchanger structure. In both cases any leakage in the piping system can be detected by monitoring the pressure in the piping system and set an alarm thus allowing to take appropriate measures against such leakage, such as for instance the stopping of the pumps, in order to reduce the pressure further and to stop the continued water supply to the leak.

Further no insulation of the piping system is required as the room temperature corresponds to the cold water return temperature, which is significant higher than the dew point.

The data centre has at least one source providing coldness being connected either directly or indirectly to the first cooling circuit as mentioned before.

Most typically, the source providing coldness is at least one cooling tower operating with counter flow, indirect draft, wet cooling tower, in which water is sprayed from the top of a column and cooled by evaporation of some of the water and thereby collected downwards. In order to avoid contamination of the first cooling circuit, the source providing coldness can be decoupled from the source providing coldness by a second cooling circuit. Such decoupling is typically achieved by redundant heat exchangers which transfer heat from the first cooling circuit to the second cooling circuit.

By way of this implementation any contamination of the second cooling circuit being directly connected to the source of coldness, which may be contaminated by air particles, such as pollen, is separated from the first cooling circuit going inside the data centre. The necessary pumps for pumping the fluid coolant can be placed inside the data centre or outside the data centre.

Depending on the environmental climate, in some geographical areas common water chillers cause problems, e.g. during cold/freeze periods. In such cases it is preferred to use so-called hybrid cooling towers instead. Most typically such hybrid coolers are plate heat exchanger through which the heated coolant is flowing through and cooled by the environmental air. One example for a hybrid cooler is shown in U.S. Pat. No. 7,864,530. To increase the cooling capacity in summer, it is possible to spray water to the surface of the plate heat exchanger and use the evaporation cooling of such water. Since these hybrid cooling towers include a heat exchanger no further heat exchangers are required. However, the cooling water may require additives, such as glycol in order to prevent it from freezing.

Further, the source providing coldness has means for conveying the liquid coolant to the cooling circuit entrance. Such means typically are pipes, preferably being flexible, made of different materials, such as steel, stainless steel and/or synthetic organic polymer materials.

In another embodiment of the instant invention, the data centre situated in a unit such as a container or the data centre is built using racks being pre-installed in support frames, which preferably are standard size frames. This allows for pre-installation/pre-assembly when building data centres or for mobile data centres. Preferably such standard size frames, units or container having the typical standard size of a common ISO container which can be transported, loaded and unloaded, stacked and transported efficiently over long distances by ship, rail, trucks, semi-trailer trucks or planes. Most preferred are 20-ft (6.1 m), 40-ft (12.2 m), 45-ft (13.7 m), 48-ft (14.6 m), and 53-ft (16.2 m) long units/containers. The width typically is 10 ft (3.0 m) to 8 ft (2.4 m) and the height typically is 9 ft 6 in (2.9 m).

The present method for operating a data centre provides a fluid coolant from the source providing coldness to the heat exchanging means (206, 207) of the racks (202) within the first cooling circuit, said fluid coolant input flow having a temperature of 1K to 5K, preferably 1K to 3K, most preferred 1K to 2K, below the temperature of the fluid coolant return flow exiting the heat exchanging means (206, 207) of the racks (202).

Preferably, the temperature of the fluid coolant entering the heat exchanging means is adjusted to 0.1 to 0.5K per kW installed and operating per Rack not exceeding 10 kW per Rack, below the temperature of the fluid coolant return flow exiting the heat exchanging means (206, 207) of the racks (202).

Preferably, the temperature of the fluid coolant entering the heat exchanging means is adjusted to 0.1 to 0.2K per kW installed and operating per Rack amounting between 10 kW and 25 kW per Rack, below the temperature of the fluid coolant return flow exiting the heat exchanging means (206, 207) of the racks (202).

Preferably, the temperature of the fluid coolant entering the heat exchanging means is adjusted to 0.1 to 0.125K per kW installed and operating per Rack amounting to above 25 kW per Rack, below the temperature of the fluid coolant return flow exiting the heat exchanging means (206, 207) of the racks (202).

The present method for operating a data centre allows for efficient cooling of a data centres. For example, the coldest temperature achievable with state of the art back cooling technology using evaporation cooling is the wet bulb temperature, which in Europe hardly reaches 22° C. The appropriate wet bulb temperatures are available at the local weather services. Typically the fluid coolant, in particular the cold water, supply is about 2 K warmer than the wet bulb temperature, which is the theoretical limit. In the preferred embodiment of the invention the heat exchanger adds another 2 K between the secondary and first circuit. However, it should be noted that this temperature difference is only a function of the size of the heat exchanger and can be cost optimised. For example, a temperature difference of +1K in the first cooling circuit (difference between heat exchanger outlet and inlet), which would correspond for example to 9 m$^3$/h water as fluid coolant and 10 kW electrical power of the IT equipment installed and operating inside the racks, the lowest fluid coolant, in particular cold water, return of the cooling system is 5K above the wet bulb temperature. Allowing for another +1K difference to the room temperature due to radiation of the warm racks, warm air leaks the room temperature is 6K warmer than the wet bulb temperature. This limit can be even reduced by increasing the pumping rate, but at the cost of higher power requirement of the pumps. However, taking into account that for instance in Germany the wet bulb temperature exceeded 20° C. during the years 2007 through 2011 for about 140 hours on average. Therefore only a small fraction of the time the pumps would have to operate on high pumping rate and therefore will only generate a small addition to the overall power budget. During cold outside temperatures the cooling system is throttled in order to keep the room temperature above 20° C.

It should be noted that basically all commercial computer systems and network components are rated to operate up to 35° C. at nearly constant walk according to ASHRAE TC 9.9 (2011) and ETSI EN 300 019-1-3; V2.3.2. (2009-07). Many vendors have announced to even increase this FIGURE towards higher temperatures because all cooling systems improve in efficiency with increased room temperatures.

If the fluid coolant, in particular cold water, return reaches 30° C. it can be used to heat buildings if they implement floor or wall heating without any heat pumps. The only additional power required is the pump to move the water through the heating manifolds inside the building and to potentially push it up towards higher floors. In summer the floor heating can be connected to the cold water supply and therefore be used for very efficient cooling of the building, however at additional cooling requirements for the cooling towers.

Most typically, most or even all racks are individually connected to the cooling circuit, which provides an efficient instrument for removing and discharging the heat from the computer hardware.

Coupling each rack to be cooled to the cooling circuit individually with the cooling circuit in connection with the rack-specific heat exchangers suitable to remove the entire heat generated by the computer hardware, provides the additional advantage that it is possible to control and monitor the cooling power and heat exchange individually and separately for each individual rack within the structure of the data centre. Cooling the hot air exclusively within the rack makes it possible to install any rack package densities without requiring air flow design, such as cold aisles or hot aisles.

The present instant invention allows using a so-called open rack architecture ensuring the racks do not need to be hermetically sealed anymore. Such open rack structure further allows easier access to the IT equipment, in particular the computer hardware, inside the rack, in case of any problems or maintenance needed. Due to the low pressure of the air flow at the rear side of the IT equipment normal openings for cabling can be easily closed.

Another preferred aspect of the present invention is that at least some or all of the racks comprise control means. In this way, the entire system may adaptively, locally react on local system failures and may automatically initiate respective provisions in order to compensate the failure.

According to another embodiment, the control means further comprise temperature sensors, leak detectors for the piping and/or the smoke detectors, whereby said detectors are coupled to an emergency alarm system, which is adapted to selectively switch off the hardware, rack and/or the relevant portion of the cooling pipe unit.

The emergency system may be designed and arranged in any of said racks individually and separated from an emergency system of neighboring or adjacent racks. Smoke and leakage detectors may be installed separately and independently from each other in order to individually switch off burning or smoking IT equipment and to be able to maintain all other operations of the data centre. Alternatively, it may also be imaginable to use a combination of individual detectors and/or to use a multi-functional detector.

According to a further embodiment, the racks further comprise power scheduling means, that are adapted to keep an overall rush-in electric current below a predefined threshold. This embodiment is adapted to prevent, that the entire data centre draws an amount of energy which cannot be provided by an external power supply. Therefore, the power scheduling means are adapted to regulate, that each rack or a pair/group of racks draws power from an electric current- or voltage supply according to a given time sheet.

For instance, a first rack may power-up after a given time-delay compared to any other rack of the data centre. In this way, peak-power consumption of the entire data centre can be kept below a predefined threshold, thus ensuring, that the external power supply does not break down. The power scheduling means may either be implemented as a specific algorithm assigning a predefined individual, hence different, time-delay to any of the racks of the data centre building.

Alternatively, it is also conceivable, that a power switch-on of the various racks is controlled by means of a central-ized architecture. However, also an interconnected emergency system is in the scope of the present invention, whereby a multiplicity of leak- and/or smoke detectors are electrically coupled to a central emergency system, which may automatically initiate respective provisions in order to counteract a system failure.

According to another preferred embodiment, the data centre further comprises at least one further cooling circuit, for example a redundant first cooling circuit, comprising the same principal structure than the first cooling circuit which takes over the duty of the first cooling structure in case of any leakage or other problem. Preferably, the cooling circuit, including the first cooling circuit, has at least two fluid coolant intakes which allows operation also in case of any leakage, partial shut-down.

According to yet another preferred embodiment, all pumps in the data center have a redundant backup pump, which can be activated in case of the primary pump failing. Proper shut-off valves allow the replacement of a broken pump while the system is operating.

The instant method allows operating the data centre at relatively high ambient temperatures, e.g. up to 30° C.

The preferred embodiment of the invention implements an additional redundancy if the racks are mounted back-back. In that case the cold air of two rack rows is mixed in the aisle between the racks. The two rack rows can easily be made independent by use of independent pipes and pumps. In case of an entire rack row failing due to a catastrophic leak or a failure of all redundant pumps the air leaving the racks connected to the failing cooling system will slowly rise until the servers exit air temperature is reached, which is typically 10K higher than the ambient temperature. For a rack with 10 kW power consumption the temperature rise is about 3K per hour. The warm air leaving the rack row with the failing cooling system is mixed with the air of the opposite rack row. Therefore the air temperature inside the aisle is on average only 5K warmer than the ambient temperature. This temperature rise can be compensated by lowering the cold water supply to the rack row with the working cooling system.

The power utility efficiency (PUE) used in connection with the instant invention is defined in "Data Center Efficiency Metrics—PUE™, Partial PUE, ERE, DCcE" (2011) by Dan Azevedo, Jud Cooley, Michael Patterson and Mark Blackburn published on www.thegreengrid.org. The by far largest contribution to the power overhead of a data centre is the cooling. Additional contributions are electric transformations and distributions, backup power generation, such as battery backup systems, air conditioning and the like. The presented invention allows reducing the cooling overhead to a minimum. The instant method allows operating the data centre at a power utility efficiency (PUE) of at most 1.3, preferably at most 1.2, more preferred at most 1.15, in particular at most 1.1

Figure 2:
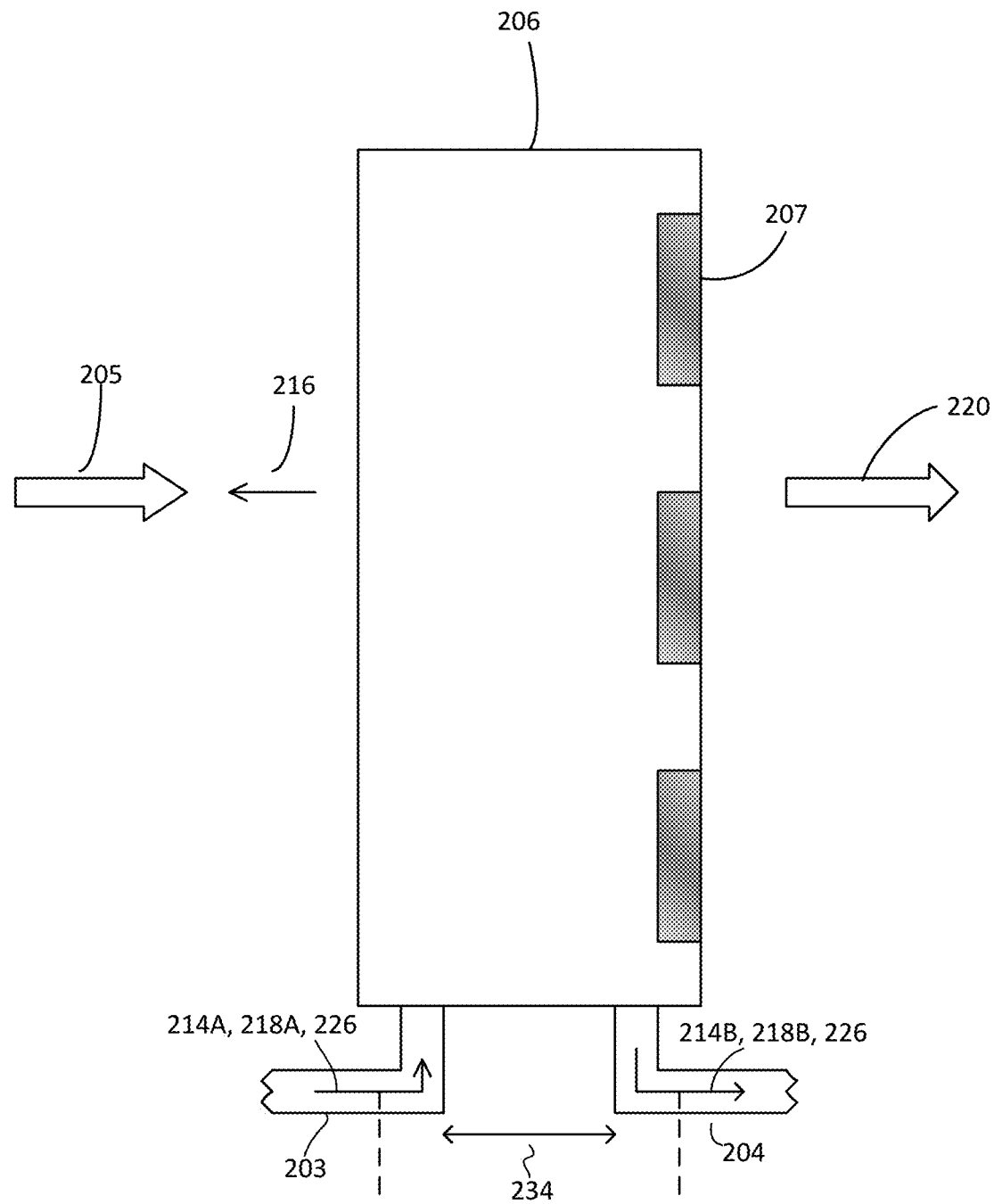

In the following, the invention will be described in detail by making reference to the drawings in which:

FIG. 1 schematically illustrates a data centre operating according to the instant method FIG. 2 schematically illustrates a heat exchanging unit of a data centre, according to an embodiment.

In the illustrated embodiment of FIG. 1, any of the racks (202) comprises a separate heat exchanging unit (206), which is equipped with a heat exchanger (207). The active means, such as the CPU cooling fan, of the IT equipment (200) facilitates an air flow (205) inside the rack (202) towards the heat exchanging unit (206). The heat exchanging units (206) are all coupled to a piping (203/204) conveying a liquid coolant, e.g. water, to any of the racks (202).

The coolant supplied by means of a piping (203/204) is beneficial in that the various racks (202) are entirely passive and no longer have to be designed as closed racks. Moreover, heat dissipation outside the various racks (202) can be effectively reduced to a minimum or even completely avoided. Hence, it is no longer necessary to control a global air stream inside the building structure. In this way generation of hot spots which might be due to some uncontrolled hot air flow outside the racks (202) can be effectively eliminated.

Additionally, the airflow throughout the data centre building structure does no longer have to be actively controlled, since the ambient temperature around the racks (202) is kept on a relatively cold level compared to the temperature inside the racks (202).

In order to implement failure tolerance on the cooling infrastructure, the racks (202) can be operated in an even/odd fashion, where every second rack is coupled to the same piping, namely either the first or second redundant first cooling circuit. In this way, two redundant first cooling circuits can be maintained providing a residual cooling capacity.

In case of a failure, for instance due to a leak in the piping (203/204), a particular rack can be selectively decoupled from the piping system (203/204).

Since there is no requirement to guide any air throughout the data centre structure, such as the space housing the multiplicity of racks, the IT equipment (200) containing racks (202) can be placed in any arbitrary arrangement. A data centre within the meaning of the instant invention contains more than one rack (202).

Rising the ambient temperature in the data centre therefore rises the fluid coolant, in particular cooling water, temperature, which directly increases the cooling efficiency of the heated fluid coolant, in particular the heated cooling water,

REFERENCE LIST OF REFERENCE NUMERALS

200 IT equipment (having a power density 224)
201 grid floor
202 rack
203/204 piping system for first cooling circuit
205 air flow inside the rack, solely created by active means contained in the IT equipment
206 heat exchanging unit
207 heat exchanger
208 height units for IT equipment
210 IT equipment fan
212 input air entering front side of racks (having room temperature 222)
214 fluid coolant flowing through heat exchanging units
214A input flow of fluid coolant (having an input coolant temperature 218A and volumetric fluid flow 226)
214B output flow of fluid coolant (having an output coolant temperature 218B and volumetric fluid flow 226)
216 air back pressure of heat exchanging unit
220 cold air exhaust temperature of air exiting heat exchanging unit
230 coolant source
232 wet bulb temperature (in proximity to the coolant source)
234 fluid pressure drop across a heat exchanging unit

EXAMPLE 1

A data centre, hosting a high performance computer consuming 500 kW of power and being installed in 34 racks each 19-inches and having 42 height units. The racks are 1.2 m deep and 70 cm wide. The rack floor space requires less than 100 m² net area.

The cooling infrastructure mainly consists of two cooling circuits, connected by a heat exchanger. The first cooling circuit transfers the heat generated in the data centre's 19-inch racks to a heat exchanger, which is cooled back by the secondary circuit. The secondary cooling circuit uses two 313 kW counter flow, indirect draft, wet cooling towers, where the makeup water is taken from a neighbouring river. The entire cooling infrastructure is mounted inside a 20 ft container with two cooling towers mounted on the roof. Said towers can be maintained and cleaned one at a time while the cooling system remains active but at reduced power. It should be noted that this scheme requires a minimum of 50 kW computer power in order to avoid freezing of the cooling systems during winter. An emergency water draining infrastructure is installed.

The entire cooling system implements three electrical consumers: the secondary pump (6 kW), the first cooling circuit pump (28 kW) and one fan in every cooling tower (4.5 kW each). While the fan power can be throttled, as the fans are not required at outside temperatures below 15° C., the two water pumps are configured to run at a constant, fixed volume current of 150 m³/h in the secondary and 220 m³/h in the first cooling circuit. The water flow rate in the first cooling circuit is sufficient to cool up to 900 kW power, while the secondary circuit supports up to two times 313 kW to date. An upgrade of the system to a total power of 900 kW is possible by adding one additional cooling tower to the existing infrastructure. With the assumption of a typical 35% average utilization of the cooling tower fans and 500 kW maximum HPC power, an average cooling overhead of 7.4% or PUE=1.074 results. In case of the fully utilized cooling system with a power load of 900 kW, the cooling overhead would be 4.9% or PUE=1.049. Further optimizations are conceivable in particular in case of the secondary pump. In case of this implementation the pump has to drive the volume current over a large distance of 120 m because the cooling container could not be placed close to the data centre room.

EXAMPLE 2

A mobile data centre container having 3 m width, 2.9 m height and 12.2 m length is equipped with 13 19" racks, each having IT equipment which operates at 35 kW. The total power of 455 kW is cooled back by a hybrid cooler. The water pump requires 10 kW and the hybrid cooler requires an additional 6 kW, which results in a power utility efficiency of PUE=1.035.

The invention claimed is:

1. A method for operating a data centre, the data centre comprising:
   a building for housing a multiplicity of racks, each rack being an open rack housing IT equipment wherein input air from the building enters a front side of the rack, each rack comprising a heat exchanger to transfer heat generated by the IT equipment to a fluid coolant, said heat exchanger located at a back side of the rack, wherein the IT equipment includes at least one fan to cool parts of the IT equipment and to create a heated air flow in the rack towards the heat exchanger located at the back side of the rack; and at least one first cooling circuit to supply the heat exchanger with the fluid coolant and to convey heated fluid coolant away from the heat exchanger, the at least one first cooling circuit coupled to a cooling source outside of the building housing the multiplicity of racks, the method comprising:

A) providing the fluid coolant in the at least one first cooling circuit such that an input flow of the fluid coolant entering the heat exchanger has a first temperature of 1 degree Kelvin to 5 degrees Kelvin below a second temperature of a return flow of the heated fluid coolant exiting the heat exchanger;

B) controlling the input flow and the return flow within the at least one first cooling circuit to maintain the first temperature of the input flow of the fluid coolant; and C) conveying the heated fluid coolant exiting the heat exchanger to the cooling source to cool the heated fluid coolant to less than or equal to the first temperature of the input flow of the fluid coolant, and returning the fluid coolant to the at least one first cooling circuit, wherein:

an input temperature of the input air from the building entering the front side of the rack is between 0 degrees Kelvin and 2 degrees Kelvin higher than the second temperature of the return flow of the heated fluid coolant exiting the heat exchanger and flowing in the first cooling circuit.

2. The method of claim 1, wherein A) comprises:
providing the fluid coolant in the at least one first cooling circuit such that the input flow of the fluid coolant entering the heat exchanger has the first temperature of 1 degree Kelvin to 3 degrees Kelvin below the second temperature of the return flow of the heated fluid coolant exiting the heat exchanger.

3. The method of claim 2, wherein A) comprises:
providing the fluid coolant in the at least one first cooling circuit such that the input flow of the fluid coolant entering the heat exchanger has the first temperature of 1 degree Kelvin to 2 degrees Kelvin below the second temperature of the return flow of the heated fluid coolant exiting the heat exchanger.

4. The method of claim 1, wherein a power density of the IT equipment in at least one rack of the multiplicity of racks is at least 5 kW per rack.

5. The method of claim 4, wherein the power density of the IT equipment in the at least one rack of the multiplicity of racks is at least 8 kW per rack.

6. The method of claim 5, wherein the power density of the IT equipment in the at least one rack of the multiplicity of racks is at least 10 kW per rack.

7. The method of claim 1, wherein the multiplicity of racks is arranged in two dimensions on one level of the building.

8. The method of claim 1, wherein the building has multiple levels, and wherein the multiplicity of racks is arranged on the multiple levels of the building.

9. The method of claim 1, wherein a power density of the IT equipment in each rack of the multiplicity of racks creates a volumetric heat dissipation rate of at least 5 $kW/m^2$.

10. The method of claim 9, wherein the volumetric heat dissipation rate created by the power density of the IT equipment in each rack of the multiplicity of racks is at least 10 $kW/m^2$.

11. The method of claim 10, wherein the volumetric heat dissipation rate created by the power density of the IT equipment in each rack of the multiplicity of racks is at least 20 $kW/m^2$.

12. The method of claim 1, wherein the input temperature of the input air from the building entering the front side of the rack is between 0 degrees Kelvin and 1 degrees Kelvin higher than the second temperature of the return flow of the fluid coolant in the first cooling circuit.

13. The method of claim 12, wherein the input temperature of the input air from the building entering the front side of the rack is between 0 degrees Kelvin and 0.5 degrees Kelvin higher than the second temperature of the return flow of the fluid coolant in the first cooling circuit.

14. The method of claim 13, wherein the input temperature of the input air from the building entering the front side of the rack is the same as the second temperature of the return flow of the fluid coolant in the first cooling circuit.

15. The method of claim 1, wherein C) comprises cooling the heated fluid coolant via at least one of:
an external ground or surface cold water source;
at least one evaporation cooling tower;
a hybrid cooler; and
a dry cooler.

16. The method of claim 1, wherein the fluid coolant entering the data centre via the at least one cooling circuit has a coolant temperature less than or equal to 0.2 degrees Kelvin below the first temperature of the input flow of the fluid coolant entering the heat exchanger.

17. The method of claim 1, wherein:
the second temperature of the return flow of the fluid coolant is less than or equal to 3 degrees Kelvin above a coolant temperature of fluid coolant entering the data centre from the cooling source; and
a power density of the IT equipment in each rack of the multiplicity of racks is less than or equal to 10 kW per rack.

18. The method of claim 17, wherein the second temperature of the return flow of the fluid coolant is less than or equal to 2 degrees Kelvin above a coolant temperature of fluid coolant entering the data centre from the cooling source.

19. The method of claim 18, wherein the second temperature of the return flow of the fluid coolant is less than or equal to 1 degree Kelvin above a coolant temperature of fluid coolant entering the data centre from the cooling source.

20. The method of claim 1, wherein the data centre does not include any air conditioner to feed cold air into the multiplicity of racks.

21. The method of claim 1, wherein the data centre does not have any active means outside of the multiplicity of racks for creating a guided airflow to feed cold air into the multiplicity of racks.

22. The method of claim 1, wherein the at least one fan included in the IT equipment creates an air flow in the rack towards the heat exchanger having an air volume current of 100 to 600 $m^3/(h*kW)$.

23. The method of claim 1, wherein the at least one fan included in the IT equipment creates an air flow in the rack towards the heat exchanger having an air flow rate of at least 0.5 m/s.

24. The method of claim 23, wherein the air flow rate of the air flow is at least 0.8 m/s.

25. The method of claim 24, wherein the air flow rate of the air flow is at least 1.1 m/s.

26. The method of claim 1, wherein:
the at least one fan included in the IT equipment creates an air flow in the rack towards the heat exchanger;
the air flow has an air flow rate of less than or equal to 1.1 m/s; and
an air back pressure of the heat exchanger corresponds to less than or equal to 20 Pa.

27. The method of claim 26, wherein:
the air flow rate of the air flow is less than or equal to 0.8 m/s; and
the air back pressure of the heat exchanger corresponds to less than or equal to 16 Pa.

28. The method of claim 27, wherein:
the air flow rate of the air flow is less than or equal to 0.5 m/s; and
the air back pressure of the heat exchanger corresponds to less than or equal to 10 Pa.

29. The method of claim 1, wherein:
a volumetric fluid flow of the fluid coolant is 3 m$^3$/hour; and
a fluid pressure drop across the heat exchanger is less than or equal to 22 kPa.

30. The method of claim 1, wherein:
a volumetric fluid flow of the fluid coolant is 5 m$^3$/hour; and
a fluid pressure drop across the heat exchanger is less than or equal to 54 kPa.

31. The method of claim 1, wherein:
a volumetric fluid flow of the fluid coolant is 10 m$^3$/hour; and
a fluid pressure drop across the heat exchanger is less than or equal to 200 kPa.

32. The method of claim 1, wherein:
a volumetric fluid flow of the fluid coolant is 0.9 m$^3$/hour per kW of the IT equipment; and
in A), a difference between the first temperature and the second temperature is 1 degree Kelvin.

33. The method of claim 1, wherein:
a volumetric fluid flow of the fluid coolant is 0.17 m$^3$/hour per kW of the IT equipment; and
in A), a difference between the first temperature and the second temperature is 5 degrees Kelvin.

34. The method of claim 1, wherein:
the first temperature of the input flow of the fluid coolant entering the heat exchanger is 0.1 degrees Kelvin to 0.5 degrees Kelvin per kW of IT equipment installed in the rack, up to a maximum of 10 kW per rack, below the second temperature of the return flow of the fluid coolant exiting the heat exchanger.

35. The method of claim 1, wherein:
the first temperature of the input flow of the fluid coolant entering the heat exchanger is 0.1 degrees Kelvin to 0.2 degrees Kelvin per kW of IT equipment installed in the rack, between 10 kW and 25 kW per rack, below the second temperature of the return flow of the fluid coolant exiting the heat exchanger.

36. The method of claim 1, wherein:
the first temperature of the input flow of the fluid coolant entering the heat exchanger is 0.1 degrees Kelvin to 0.125 degrees Kelvin per kW of IT equipment installed in the rack, for greater than 25 kW per rack, below the second temperature of the return flow of the fluid coolant exiting the heat exchanger.

37. The method of claim 1, wherein the heat exchanger has an air back pressure that does not significantly impede the heated air flow and a fluid pressure drop across the heat exchanger of less than 200 kPa for the fluid coolant.

38. The method of claim 1, wherein a cold air exhaust temperature of air exiting the heat exchanger into the data centre is:
less than or equal to 2 degrees Kelvin above the second temperature of the return flow of the heated fluid coolant exiting the heat exchanger; and
less than or equal to the input air temperature of the input air in the building entering the front side of the rack.

39. A data centre comprising:
a building;
a multiplicity of racks housed in the building, each rack being an open rack housing IT equipment wherein input air from the building enters a front side of the rack, each rack comprising a heat exchanger to transfer heat generated by the IT equipment to a fluid coolant, said heat exchanger located at a back side of the rack, wherein the IT equipment includes at least one fan to cool parts of the IT equipment and to create a heated air flow in the rack towards the heat exchanger located at the back side of the rack; and
at least one first cooling circuit to supply the heat exchanger with the fluid coolant and to convey heated fluid coolant away from the heat exchanger, the at least one first cooling circuit coupled to a cooling source outside of the building housing the multiplicity of racks;
wherein:
an input flow of the fluid coolant entering the heat exchanger has a first temperature of 1 degree Kelvin to 5 degrees Kelvin below a second temperature of a return flow of the heated fluid coolant exiting the heat exchanger;
the cooling source cools the heated fluid coolant to less than or equal to the first temperature of the input flow of the fluid coolant; and
an input temperature of the input air from the building entering the front side of the rack is between 0 degrees Kelvin and 2 degrees Kelvin higher than the second temperature of the return flow of the heated fluid coolant exiting the heat exchanger and flowing in the first cooling circuit.

40. The data centre of claim 39, wherein the first temperature is 1 degree Kelvin to 2 degrees Kelvin below the second temperature of the return flow of the heated fluid coolant exiting the heat exchanger.

41. The data centre of claim 39, wherein a power density of the IT equipment in at least one rack of the multiplicity of racks is at least 5 kW per rack.

42. The data centre of claim 39, wherein the multiplicity of racks is arranged in two dimensions on one level of the building.

43. The data centre of claim 39, wherein the building has multiple levels, and wherein the multiplicity of racks is arranged on the multiple levels of the building.

44. The data centre of claim 39, wherein the input temperature of the input air from the building housing the multiplicity of racks is between 0 degrees Kelvin and 1 degrees Kelvin higher than the second temperature of the return flow of the fluid coolant in the first cooling circuit.

45. The data centre of claim 44, wherein the input temperature of the input air from the building housing the multiplicity of racks is between 0 degrees Kelvin and 0.5 degrees Kelvin higher than the second temperature of the return flow of the fluid coolant in the first cooling circuit.

46. The data centre of claim 45, wherein the input temperature of the input air from the building housing the multiplicity of racks is the same as the second temperature of the return flow of the fluid coolant in the first cooling circuit.

47. The data centre of claim 39, wherein the cooling source comprises at least one of:
   an external ground or surface cold water source;
   at least one evaporation cooling tower;
   a hybrid cooler; and
   a dry cooler.

48. The data centre of claim 39, wherein the fluid coolant entering the data centre via the at least one cooling circuit has a coolant temperature less than or equal to 0.2 degrees Kelvin below the first temperature of the input flow of the fluid coolant entering the heat exchanger.

49. The data centre of claim 39, wherein the data centre does not include any air conditioner to feed cold air into the multiplicity of racks.

50. The data centre of claim 39, wherein the data centre does not have any active means outside of the multiplicity of racks for creating a guided airflow to feed cold air into the multiplicity of racks.

51. The data centre of claim 39, wherein:
   the at least one fan included in the IT equipment creates an air flow in the rack towards the heat exchanger;
   the air flow has an air flow rate of less than or equal to 1.1 m/s; and
   an air back pressure of the heat exchanger corresponds to less than or equal to 20 Pa.

52. The data centre of claim 39, wherein:
   a volumetric fluid flow of the fluid coolant is between 3 $m^3$/hour and 10 $m^3$/hour; and
   a fluid pressure drop across the heat exchanger is between 22 kPa and 200 kPa.

53. The data centre of claim 39, wherein the heat exchanger has an air back pressure that does not significantly impede the heated air flow and a fluid pressure drop across the heat exchanger of less than 200 kPa for the fluid coolant.

54. The data centre of claim 39, wherein a cold air exhaust temperature of air exiting the heat exchanger into the data centre is:
   less than or equal to 2 degrees Kelvin above the second temperature of the return flow of the heated fluid coolant exiting the heat exchanger; and
   less than or equal to the input temperature of the input air from the building entering the front side of the rack.

* * * * *